(12) United States Patent
Huang et al.

(10) Patent No.: US 12,034,006 B2
(45) Date of Patent: Jul. 9, 2024

(54) INPUT/OUTPUT SEMICONDUCTOR DEVICES

(71) Applicant: Taiwan Semiconductor Manufacturing Co., Ltd., Hsinchu (TW)

(72) Inventors: Mao-Lin Huang, Hsinchu (TW); Lung-Kun Chu, New Taipei (TW); Chung-Wei Hsu, Hsinchu (TW); Jia-Ni Yu, Hsinchu (TW); Kuo-Cheng Chiang, Hsinchu County (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 245 days.

(21) Appl. No.: 17/554,811

(22) Filed: Dec. 17, 2021

(65) Prior Publication Data

US 2022/0108984 A1 Apr. 7, 2022

Related U.S. Application Data

(62) Division of application No. 16/583,406, filed on Sep. 26, 2019, now Pat. No. 11,205,650.

(51) Int. Cl.
*H01L 27/092* (2006.01)
*H01L 21/8238* (2006.01)
(Continued)

(52) U.S. Cl.
CPC .. *H01L 27/0924* (2013.01); *H01L 21/823807* (2013.01); *H01L 21/823821* (2013.01); *H01L 21/823857* (2013.01); *H01L 29/42368* (2013.01); *H01L 29/42392* (2013.01); *H01L 29/4966* (2013.01); *H01L 29/517* (2013.01); *H01L 29/78696* (2013.01)

(58) Field of Classification Search
None
See application file for complete search history.

(56) References Cited

U.S. PATENT DOCUMENTS 8,963,258 B2 2/2015 Yu et al.
9,818,872 B2 11/2017 Ching et al.
(Continued)

*Primary Examiner* — Michelle Mandala
(74) *Attorney, Agent, or Firm* — HAYNES AND BOONE, LLP

(57) ABSTRACT

A semiconductor device according to an embodiment includes a first gate-all-around (GAA) transistor and a second GAA transistor. The first GAA transistor includes a first plurality of channel members, a first interfacial layer over the first plurality of channel members, a first hafnium-containing dielectric layer over the first interfacial layer, and a metal gate electrode layer over the first hafnium-containing dielectric layer. The second GAA transistor includes a second plurality of channel members, a second interfacial layer over the second plurality of channel members, a second hafnium-containing dielectric layer over the second interfacial layer, and the metal gate electrode layer over the second hafnium-containing dielectric layer. A first thickness of the first interfacial layer is greater than a second thickness of the second interfacial layer. A third thickness of the first hafnium-containing dielectric layer is smaller than a fourth thickness of the second hafnium-containing dielectric layer.

20 Claims, 16 Drawing Sheets

(51) Int. Cl.
  *H01L 29/423* (2006.01)
  *H01L 29/49* (2006.01)
  *H01L 29/51* (2006.01)
  *H01L 29/786* (2006.01)

(56) References Cited

U.S. PATENT DOCUMENTS

| | | |
|---|---|---|
| 9,887,269 B2 | 2/2018 | Ching et al. |
| 9,899,398 B1 | 2/2018 | Colinge et al. |
| 10,032,627 B2 | 7/2018 | Lee et al. |
| 10,109,721 B2 | 10/2018 | Lin et al. |
| 10,157,799 B2 | 12/2018 | Ching et al. |
| 10,199,502 B2 | 2/2019 | Huang et al. |
| 10,290,546 B2 | 5/2019 | Chiang et al. |
| 10,559,566 B1 * | 2/2020 | Lee ................ H01L 29/78 |
| 10,734,286 B1 | 8/2020 | Ando |
| 2015/0194489 A1 | 7/2015 | Barraud |
| 2018/0175036 A1 | 6/2018 | Ching et al. |
| 2020/0258785 A1 | 8/2020 | Zhang |
| 2020/0258786 A1 * | 8/2020 | Ando ............ H01L 21/02532 |
| 2021/0020644 A1 * | 1/2021 | Paul ............ H01L 21/28123 |

* cited by examiner

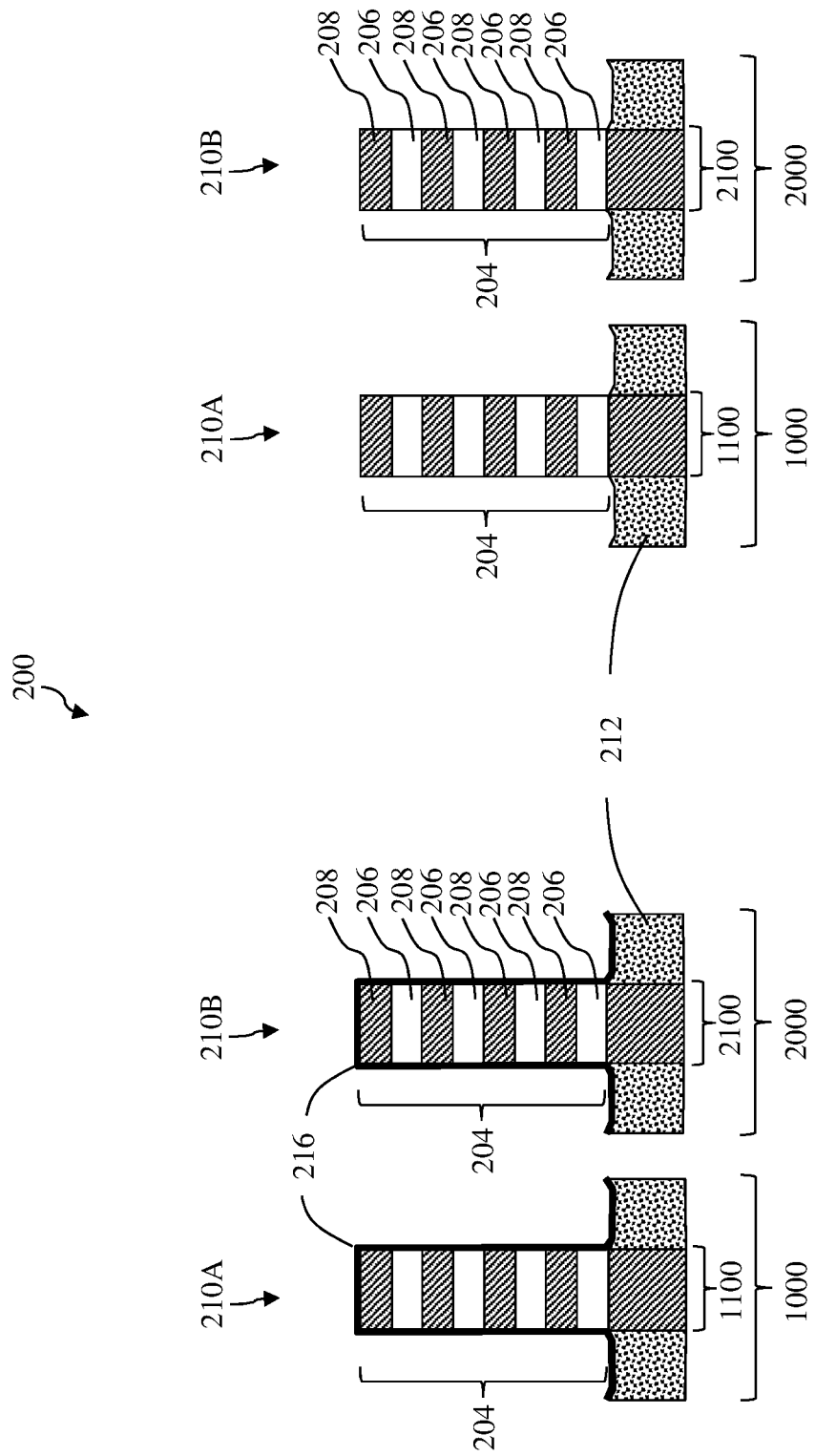

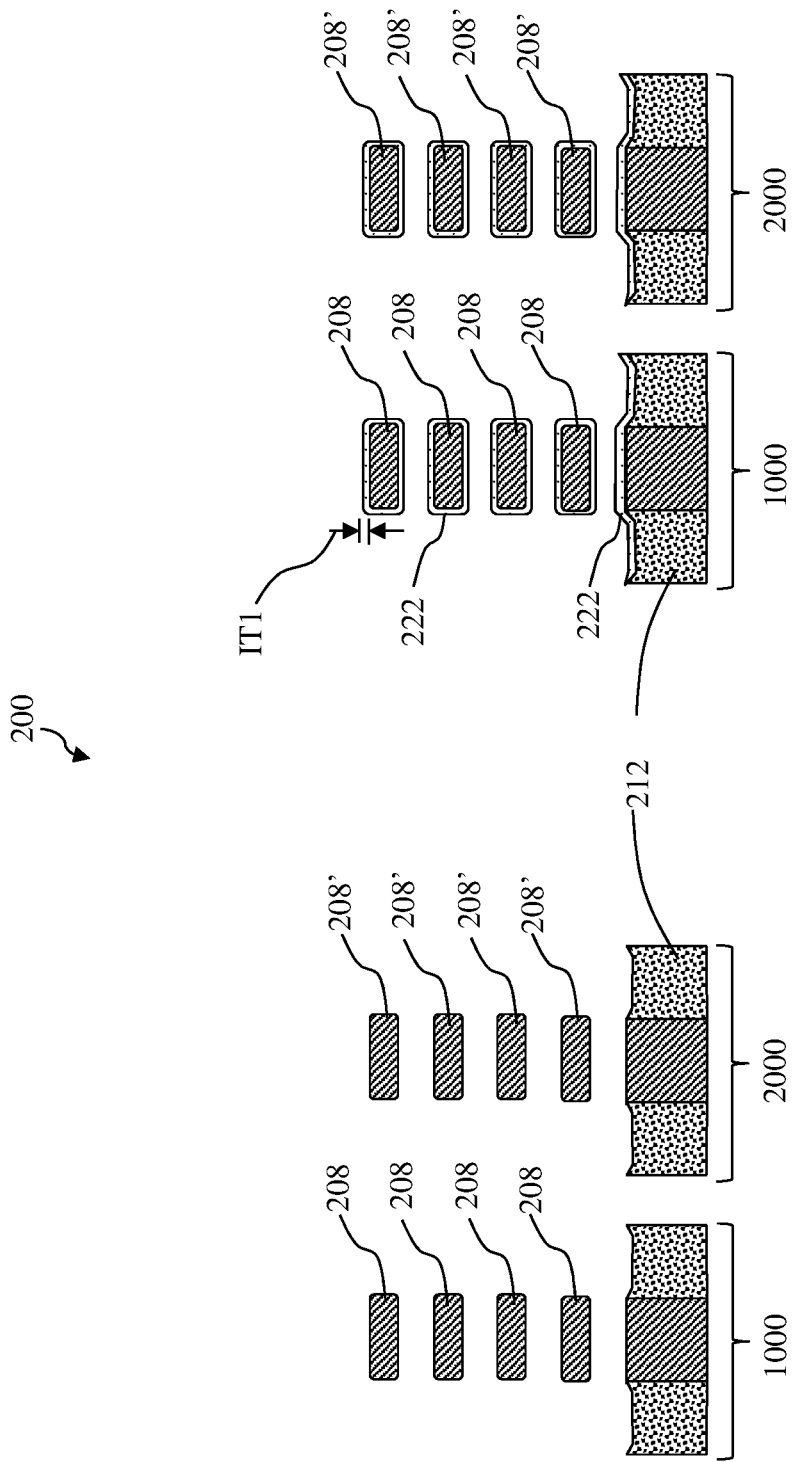

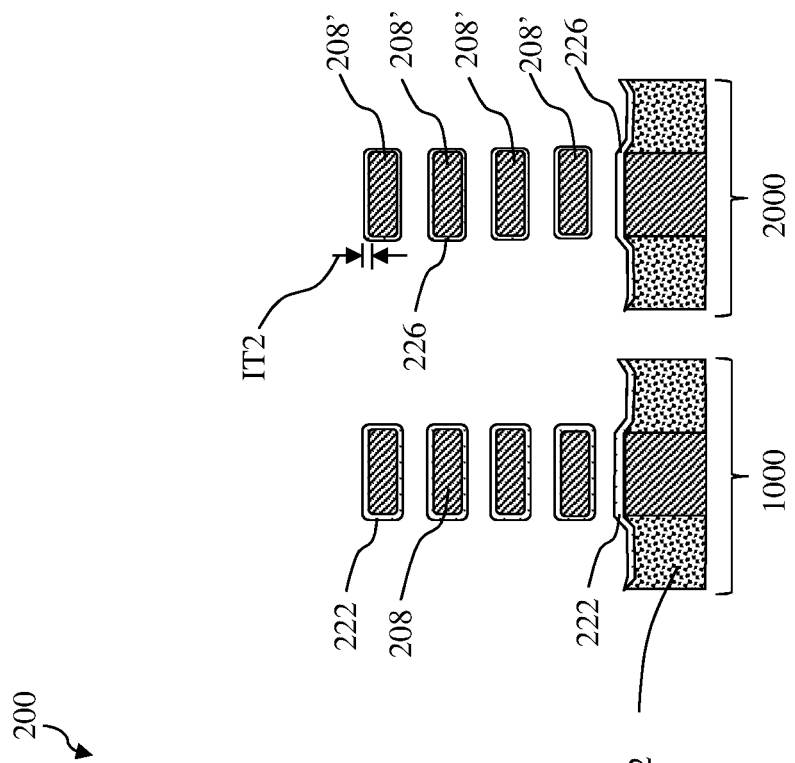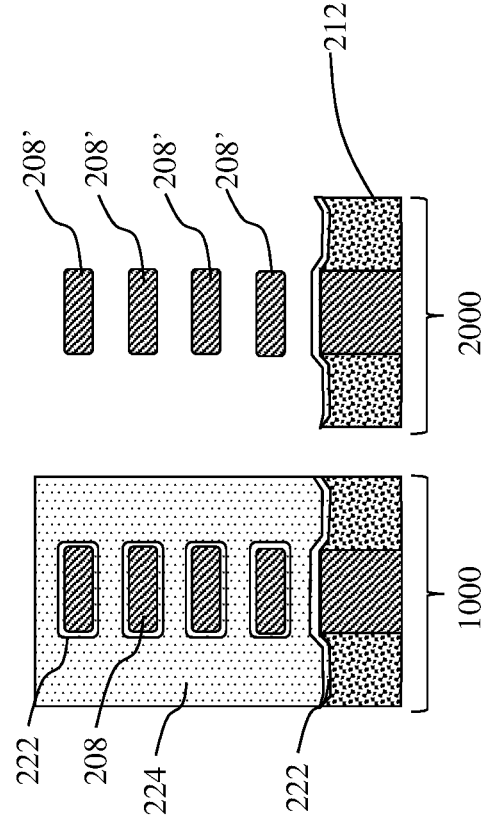
Fig. 7
Fig. 8

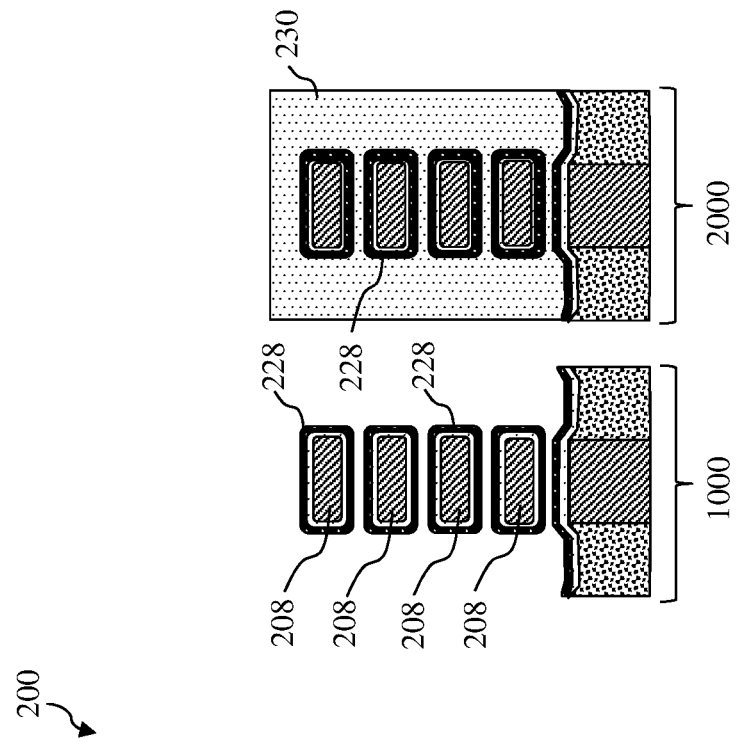
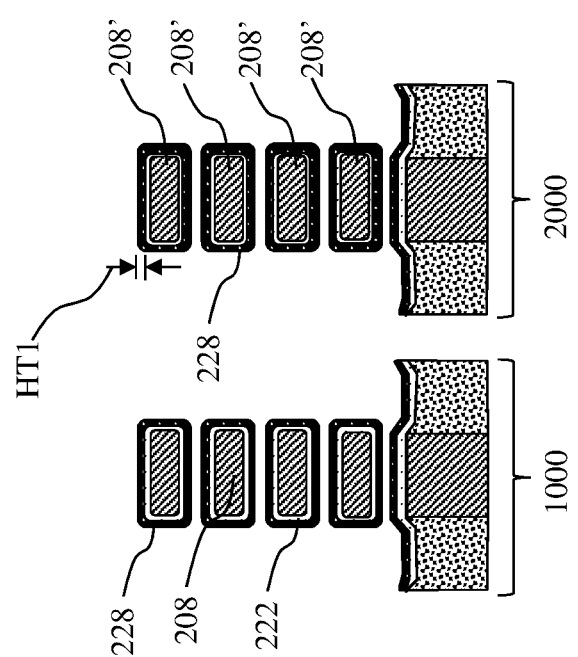

INPUT/OUTPUT SEMICONDUCTOR DEVICES

PRIORITY DATA

The application is a divisional application of U.S. patent application Ser. No. 16/583,406, filed Sep. 26, 2019, the entirety of which is hereby incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate devices have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and gate-all-around (GAA) transistors (both also referred to as non-planar transistors) are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). Compared to planar transistors, such configuration provides better control of the channel and drastically reduces SCEs (in particular, by reducing sub-threshold leakage (i.e., coupling between a source and a drain of the FinFET in the "off" state)). A GAA transistor has a gate structure that can extend, partially or fully, around a channel region to provide access to the channel region on two or more sides. The channel region of the GAA transistor may be formed from nanowires, nanosheets, other nanostructures, and/or other suitable structures. In some implementations, such channel region includes multiple nanowires (which extend horizontally, thereby providing horizontally-oriented channels) vertically stacked. Such GAA transistor can be referred to as a vertically-stacked horizontal GAA (VGAA) transistor.

IC devices include transistors that serve different functions, such as input/output (I/O) functions and core functions. These different functions require the transistors to have different constructions. At the same time, it is advantageous to have similar processes and similar process windows to fabricate these different transistors to reduce cost and improve yield. Although existing GAA transistors and processes are generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

FIGS. 3-12 illustrate fragmentary cross-sectional views of the first area and the second area of the workpiece at various stages of fabrication in accordance with the method in FIG. 1.

DETAILED DESCRIPTION

Figure 1:
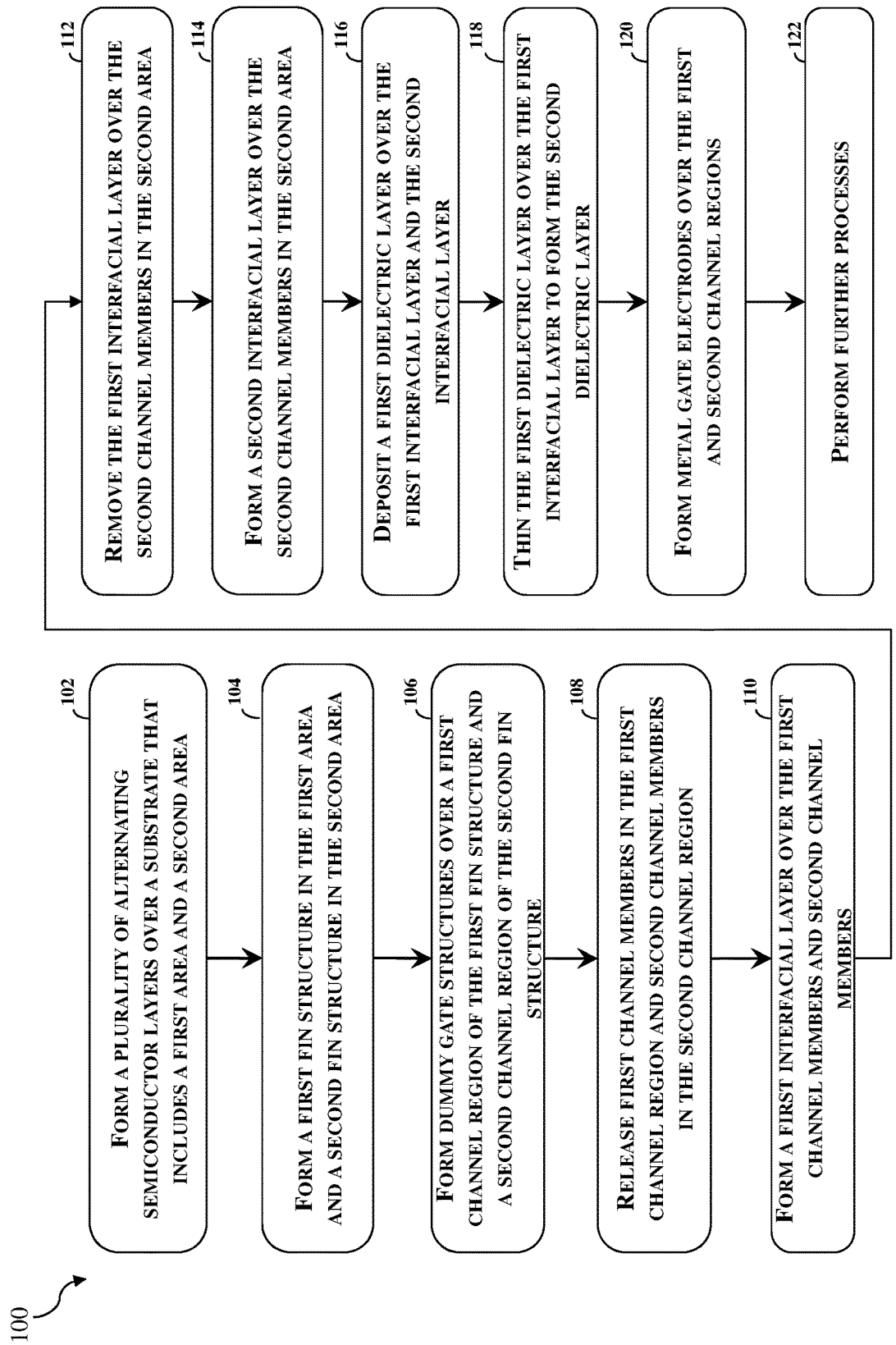
FIG. 1 is a flowchart illustrating a method of forming a semiconductor device according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure relates to GAA transistors, and more particularly, to input/output (I/O) GAA transistors in a semiconductor device. A semiconductor device according to embodiments of the present disclosure includes a first-type GAA transistor in an I/O device area to serve I/O functions and a second-type GAA transistor in a core device area to serve logic functions. Both the first-type GAA transistor and the second-type GAA transistor include interfacial layers disposed directly on channel members. To accommodate higher operating voltages, the interfacial layer in the I/O device area is made thicker to prevent or reduce leakage. Conventionally, a high dielectric constant (high-k) dielectric layer of a substantially uniform thickness is deposited over the interfacial layers in the I/O and core device areas. When those conventional techniques are adopted, the high-k dielectric layer and the interfacial layer for the first-type GAA transistor may reduce the spacing between neighboring channel members, allowing little or no process window for deposition of dipole layers, work function layers and metal fill layers. The present disclosure provides a process to thin the high-k dielectric layer in the I/O device areas to make room for dipole layers or gate fill layers, thereby ensuring process windows and performance.

FIG. 1 illustrates a flow chart of a method 100 for fabricating a semiconductor device according to various aspects of the present disclosure. FIG. 1 will be described below in conjunction with FIGS. 2A, 2B, and 3-12, which are fragmentary cross-sectional views of a workpiece at various stages of fabrication according to method 100 in FIG. 1 before the semiconductor device is fabricated on the workpiece. Throughout the present disclosure, for the ease of reference, the workpiece and the semiconductor device may be referred to interchangeably as the workpiece is to become the semiconductor device at the conclusion of the processes and may share the same reference numeral. Additional steps can be provided before, during, and after method 100, and some of the steps described can be moved, replaced, or eliminated for additional embodiments of method 100. Additional features can be added in the semiconductor device depicted in FIGS. 2A, 2B, and 3-12 and some of the features described below can be replaced, modified, or eliminated in other embodiments of the semiconductor device.

Figure 2A:
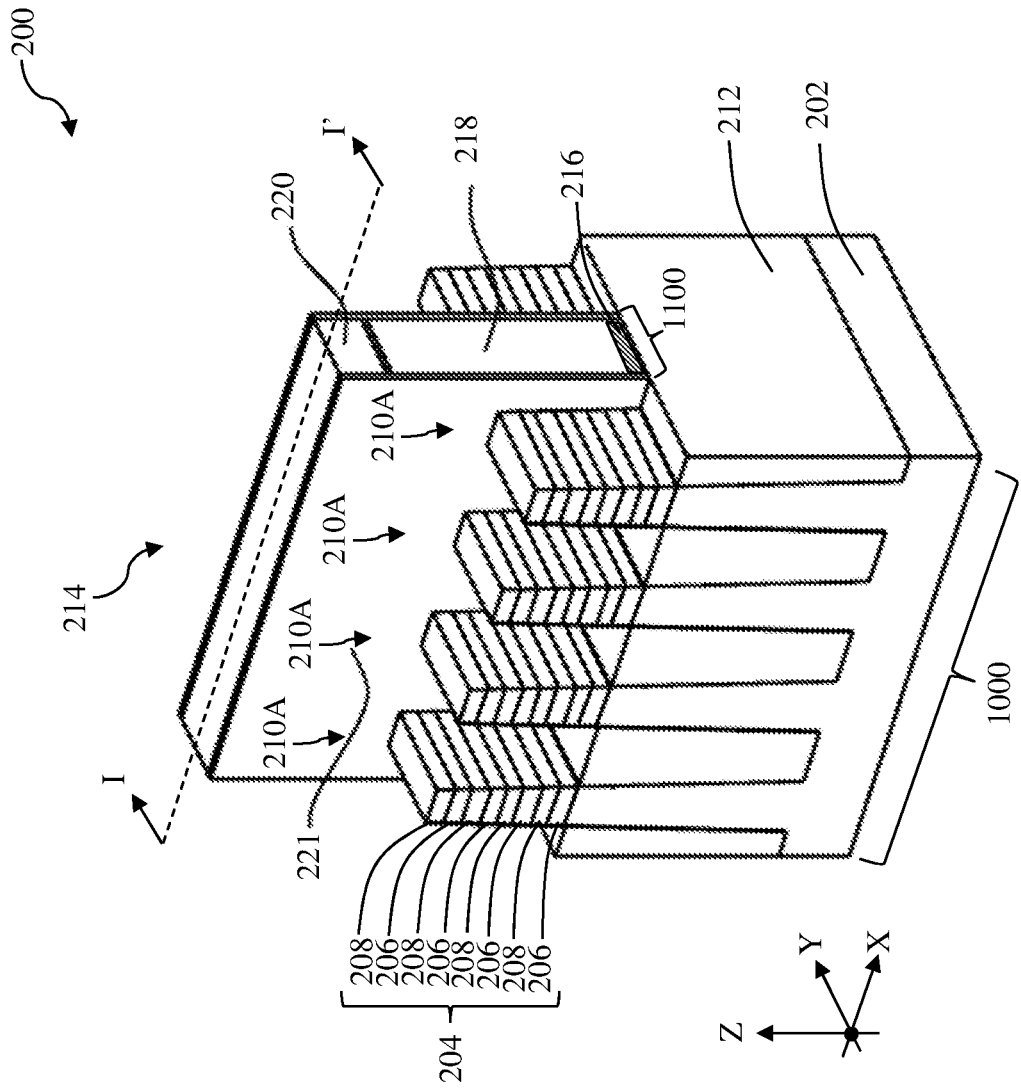
FIG. 2A is a diagrammatic perspective view of a first area of a workpiece, according to various aspects of the present disclosure.
Figure 2B:
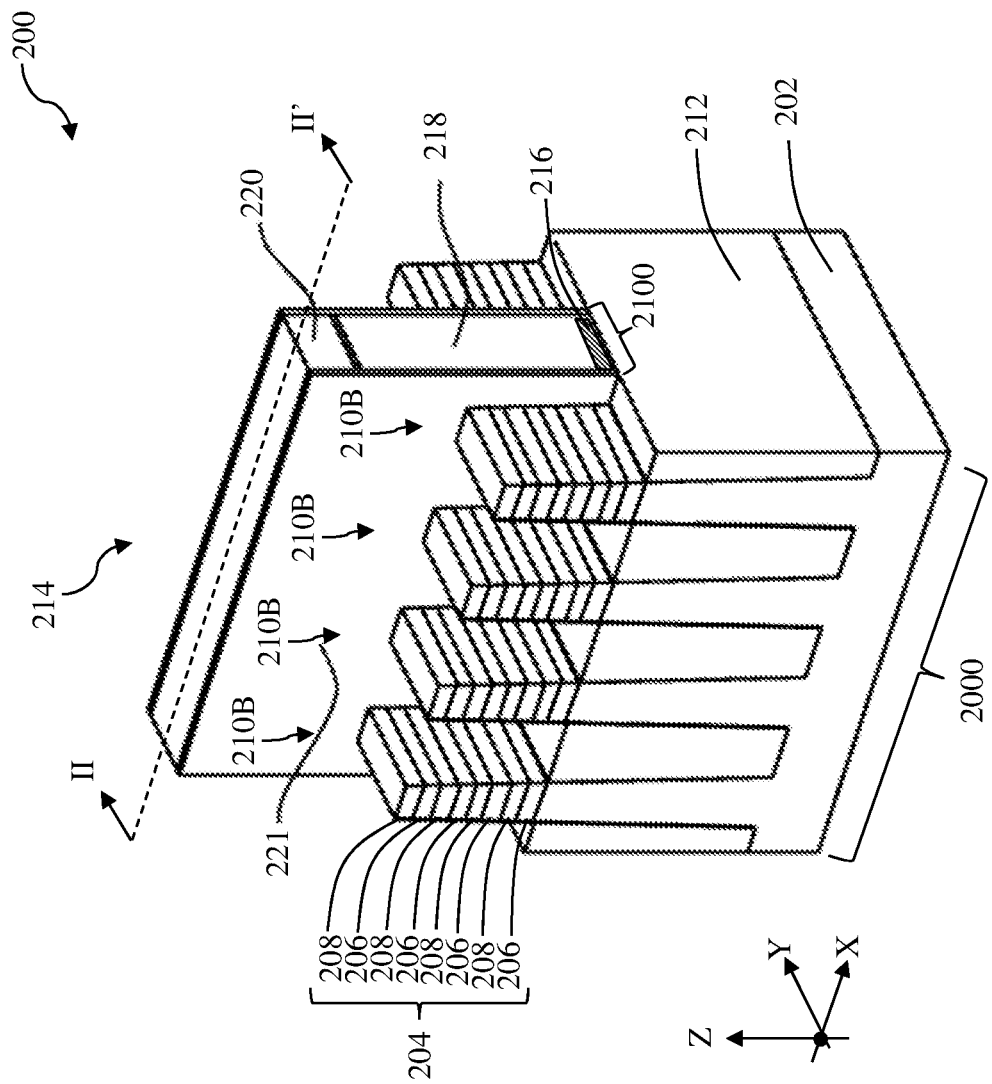
FIG. 2B is a diagrammatic perspective view of a second area of a workpiece, according to various aspects of the present disclosure.

Referring now to FIGS. 1, 2A and 2B, the method 100 includes a block 102 where a plurality of alternating semiconductor layers 204 over a first area 1000 and a second area 2000 on a substrate 202 of a workpiece 200. The first area 1000 of the workpiece 200 is illustrated in FIG. 2A and the second area 2000 of the workpiece 200 is illustrated in FIG. 2B. In some embodiments, the substrate 202 includes silicon. Alternatively or additionally, substrate 202 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. In some implementations, the substrate 202 includes one or more group III-V materials, one or more group II-IV materials, or combinations thereof. In some implementations, the substrate 202 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. The substrate 202 can include various doped regions configured according to design requirements of semiconductor device 200. P-type doped regions may include p-type dopants, such as boron, indium, other p-type dopant, or combinations thereof. N-type doped regions may include n-type dopants, such as phosphorus, arsenic, other n-type dopant, or combinations thereof. In some implementations, the substrate 202 includes doped regions formed with a combination of p-type dopants and n-type dopants. The various doped regions can be formed directly on and/or in substrate 202, for example, providing a p-well structure, an n-well structure, a dual-well structure, a raised structure, or combinations thereof. An ion implantation process, a diffusion process, and/or other suitable doping process can be performed to form the various doped regions. In some embodiments, p-type GAA devices are formed over n-type wells and n-type GAA devices are formed over p-type wells.

The first area 1000 and the second area 2000 are device areas that include transistors serving different functions. In some embodiments, the first area 1000 is an input/output (I/O) device area (or I/O area) and may be referred to as an I/O device area 1000 or an I/O area 1000. Similarly, the second area 2000 is a core device area (or core area) and may be referred to as a core device area 2000 or a core area 2000. In those embodiments, a core device area refers to a device area that includes logic cells, such as inverter, NAND, NOR, AND, OR, and Flip-Flop, as well as memory cells, such as static random access memory (SRAM), dynamic random access memory (DRAM), and Flash. An I/O device area refers to a device area that interfaces between a core device area and external/peripheral circuitry, such as the circuit on the printed circuit board (PCB) on which the semiconductor device 200 is mounted. Operating voltage for the I/O device area 1000 is similar to external voltage (voltage level of the external/peripheral circuitry) and is higher than the operating voltage of the core device area 2000. To accommodate the higher operating voltage, transistors in the I/O device area 1000 may have a thicker interfacial layer as compared to their counterparts in the core device area. In conventional processes, a high-k dielectric layer is also deposited over the interfacial layers in the I/O device area 1000 and the core device area 2000. The thicker interfacial layer and the high-k dielectric layer in the I/O device area 1000 may reduce the spacing between channel members, thus substantially reducing or even eliminating the process window to form various layers of a metal gate electrode around the channel members. As a compromise, conventional processes often adopt a common metal gate electrode structure for GAA transistors in the I/O device area 1000, resulting reduced performance. As will be described below, embodiments of the present disclosure provide advantages because the high-k dielectric layer in the first area 1000 of a semiconductor device is thinned or even completely removed to make room for various layers in a metal gate electrode, thus improving performance of the semiconductor device 200. At the same time, the formation processes for the GAA transistors in the I/O device area 1000 (first area 1000) and the core device area 2000 (second area 2000) share substantially similar operations, thus reducing the manufacturing cost.

In the embodiments represented in FIGS. 2A and 2B, the plurality of alternating semiconductor layers 204 includes a plurality of first semiconductor layers 208 interleaved by a plurality of the second semiconductor layers 206. That is, two neighboring first semiconductor layers 208 sandwich one second semiconductor layer 206. The plurality of first semiconductor layers 208 is formed of a first semiconductor material and the plurality of second semiconductor layers 206 is formed of a second semiconductor material that is different from the first semiconductor material. In some embodiments, the first semiconductor material is or consists essentially of silicon (Si) and the second semiconductor material is or consists essentially of silicon germanium (SiGe). The first plurality of alternating semiconductor layers 204 may be formed by depositing or epitaxially growing the plurality of first semiconductor layers 208 and the plurality of second semiconductor layers 206 alternatingly. In some implementations, after the first plurality of alternating semiconductor layers 204 is patterned into fin structures (fin-shaped active regions), a portion of the plurality of the second semiconductor layers 206 in channel regions may be selectively removed to release channel members formed from the plurality of the first semiconductor layers 208. In this regard, the second semiconductor layers 206 function as sacrificial semiconductor layers and may be referred to as so.

Referring still to FIGS. 1, 2A and 2B, the method 100 includes a block 104 where a first fin structure 210A is formed in the first area 1000 and a second fin structure 210B is formed in the second area 2000. As shown in FIG. 2A, the plurality of alternating semiconductor layers 204 may be patterned to form the first fin structure 210A in the first area 1000 and as shown in FIG. 2B, the plurality of alternating semiconductor layers 204 may be patterned to form the second fin structure 210B in the second area 2000. At block 104, the first fin structures 210A and the second fin structures 210B may be patterned by using suitable processes such as photolithography and etching processes. In some embodiments, the fin structures are etched from the plurality of alternating semiconductor layers 204 using dry etch or plasma etch processes. In some other embodiments, the fin structures can be formed by a double-patterning lithography (DPL) process, a quadruple-patterning lithography (QPL) process or a multiple-patterning lithography (MPL) process. Generally, DPL, QPL and MPL processes combine photolithography and self-aligned processes, allowing patterns to be created that have, for example, pitches smaller than what is otherwise obtainable using a single, direct photolithography process. In some implementations, dielectric isolation features 212 are formed among the first fin structures 210A and the second fin structures 210B. The dielectric isolation features 212 may also be referred to as shallow trench isolation (STI) features 212.

Referring still to FIGS. 1, 2A and 2B, the method 100 includes a block 106 where a dummy gate structure 214 is formed over a first channel region 1100 of the first fin structure 210A and a second channel region 2100 of the second fin structure 210B. As illustrated in FIGS. 2A and 2B, the dummy gate structure 214 may include a dummy gate dielectric layer 216, a dummy gate electrode 218, a gate top hard mask 220, and a gate spacer 221. In some embodiments, the dummy gate electrode 218 may be formed of polysilicon and the dummy gate dielectric layer 216 may be formed of silicon oxide, or silicon oxynitride. The gate top hard mask 220 may be formed of silicon oxide or silicon nitride. In some implementations, the gate top hard mask 220 may include multiple layers. For example, the gate top hard mask 220 may include a silicon oxide layer adjacent the dummy gate electrode 218 and a silicon nitride layer over the silicon oxide layer. The gate spacer 221 extend along sidewalls of the dummy gate electrode 218 and define the first channel region 1100 and the second channel region 2100. In some embodiments, the gate spacer 221 may be formed of silicon oxide, silicon oxynitride, silicon nitride, silicon oxycarbonitride, a low-k dielectric material with a dielectric constant lower than 4, or a combination thereof.

For clarity of description and illustration, each of FIGS. 3-12 includes a fragmentary cross-sectional view of a first fin structure 210A along the section I-I' shown in FIG. 2A and a fragmentary cross-sectional view of a second fin structure 210B along the section II-II' shown in FIG. 2B. As shown in FIG. 2A, the section I-I' extends along the dummy gate structure 214 and passes the first channel region 1100. As shown in FIG. 2B, the section II-II' extends along the dummy gate structure 214 and passes the second channel region 2100.

Referring to FIGS. 1 and 3-5, the method 100 includes a block 108 where first channel members 208 in the first channel region 1100 are released and second channel members 208' in the second channel region 2100 are released. In some embodiments, after the dummy gate structure 214 is formed at block 106, the dummy gate structure 214 is used as an etch mask to recess the first fin structure 210A and the second fin structure 210B to form source/drain trenches to expose sidewalls of the plurality of first semiconductor layers 208 and the plurality of the second semiconductor layers 206 in the first channel region 1100 and the second channel region 2100. In some embodiments, the plurality of the second semiconductor layers 206 in the first channel region 1100 and the second channel region 2100 may be selectively and partially etched to form inner spacer recesses between two of the plurality of first semiconductor layers 208. An inner spacer feature is then formed within the inner spacer recesses. Then epitaxial source/drain features may be formed in the source/drain trenches. After the epitaxial source/drain features are formed, an interlayer dielectric (ILD) layer may be deposited over the workpiece 200. A planarization process, such as a chemical mechanical polishing (CMP) process, may be performed to planarize the workpiece 200 until the dummy gate electrode 218 is exposed. The exposed dummy gate electrode 218 may then be selectively removed using a suitable dry etch or wet etch process. FIG. 3 illustrates the plurality of alternating semiconductor layers 204 in the first channel region 1100 and the second channel region 2100 after the dummy gate electrode 218 is removed. In some embodiments, the dummy gate dielectric layer 216 may be removed using a suitable etch process that is different from the one used to remove the dummy gate electrode 218. FIG. 4 illustrates the plurality of alternating semiconductor layers 204 in the first channel region 1100 and the second channel region 2100 after the dummy gate dielectric layer 216 is removed. After the dummy gate dielectric layer 216 is removed, the plurality of second semiconductor layers 206 may be selectively removed. In some implementations, the plurality of second semiconductor layers 206 are formed of silicon germanium and selectively removal process includes oxidizing the plurality of second semiconductor layers 206 using a suitable oxidizer, such as ozone. Thereafter, the oxidized second semiconductor layers 206 may be selectively removed. At this point, as shown in FIG. 5, the first channel members 208 are formed in the first area 1000 and the second channel members 208' are formed in the second area 2000.

Referring to FIGS. 1 and 6, the method 100 includes a block 110 where a first interfacial layer 222 is formed over the first channel members 208 in the first area 1000 and second channel members 208' in the second area 2000. In some embodiments, the first interfacial layer 222 may include silicon oxide or silicon oxynitride, or other suitable material. In some embodiments, the first interfacial layer 222 may be deposited using a suitable method, such as atomic layer deposition (ALD), chemical vapor deposition (CVD), ozone oxidation, thermal oxidation, or other suitable method. In some embodiments, the deposition of the first interfacial layer 222 is time controlled such that a first thickness (IT1) is between about 15 Å and about 35 Å. Interfacial layers, such as the first interfacial layer 222, serve the function to control and reduce gate leakage current. As will be described below, a high-k dielectric layer over the first interfacial layer may be thinned or even entirely removed in some instances. In instances where the high-k dielectric layer is completely removed from the first interfacial layer 222, the first interfacial layer 222 may be formed to a thickness between about 15 Å and about 35 Å to compensate for the reduced thickness or lack of the high-k dielectric layer.

Referring to FIGS. 1 and 7, the method 100 includes a block 112 where the first interfacial layer 222 over the second channel members 208' in the second area 2000 is removed. In some embodiments, a first mask layer 224 may be formed over the first area 1000 to cover the first interfacial layer 222 over the first channel members 208 while the first interfacial layer 222 in the second area 2000 is exposed. In some embodiments, the first mask layer 224 may be a photoresist layer, such as a bottom antireflective coating (BARC) layer. At block 112, the exposed first interfacial layer 222 in the second area 2000 is substantially removed such that the second channel members 208' are substantially exposed in the second area 2000.

Referring to FIGS. 1 and 8, the method 100 includes a block 114 where a second interfacial layer 226 is formed over the second channel members 208' in the second area 2000. In embodiments of the present disclosure, the interfacial layer on the second channel members 208' is formed anew at block 114 to a second thickness IT2 smaller than the first thickness IT1. Similar to the first interfacial layer 222, the second interfacial layer 226 may include silicon oxide or silicon oxynitride, or other suitable material. The second interfacial layer 226 may also be deposited using a method similar to that used to form the first interfacial layer 222, such as ALD, CVD, ozone oxidation, thermal oxidation, or other suitable method. In some embodiments, the deposition of the second interfacial layer 226 is time controlled such that the second thickness IT2 is between about 5 Å and about 15 Å. As shown in FIG. 8, after the second interfacial layer 226 is formed, the first mask layer 224 is removed by ashing or a suitable method.

Referring to FIGS. 1 and 9, the method 100 includes a block 116 where a first dielectric layer 228 is deposited over the first interfacial layer 222 in the first area 1000 and the second interfacial layer 226 in the second area 2000. In some embodiments, the first dielectric layer 228 is high-k dielectric layer as its dielectric constant is greater than that of silicon oxide (~3.9). In some implementations, the first dielectric layer 228 includes hafnium and may be referred to as a hafnium-containing dielectric layer or a hafnium-containing high-k dielectric layer. In some instances, the first dielectric layer 228 includes doped or undoped hafnium oxide. In instances where the first dielectric layer 228 includes doped hafnium oxide, it is doped with zirconium, aluminum, silicon, or nitrogen. In some embodiments, the first dielectric layer 228 may be formed of hafnium oxide, hafnium zirconium oxide, hafnium silicon oxide, hafnium silicon oxynitride, hafnium aluminum oxide, or a combination thereof. At block 116, the first dielectric layer 228 is deposited over both the first interfacial layer 222 in the first area 1000 and the second interfacial layer 226 in the second area 2000 and is deposited to a first high-k thickness (HT1) between about 13 Å and about 20 Å to suit design requirements for the GAA transistors in the core device area 2000 (i.e., second area 2000).

Figures 11, 12:
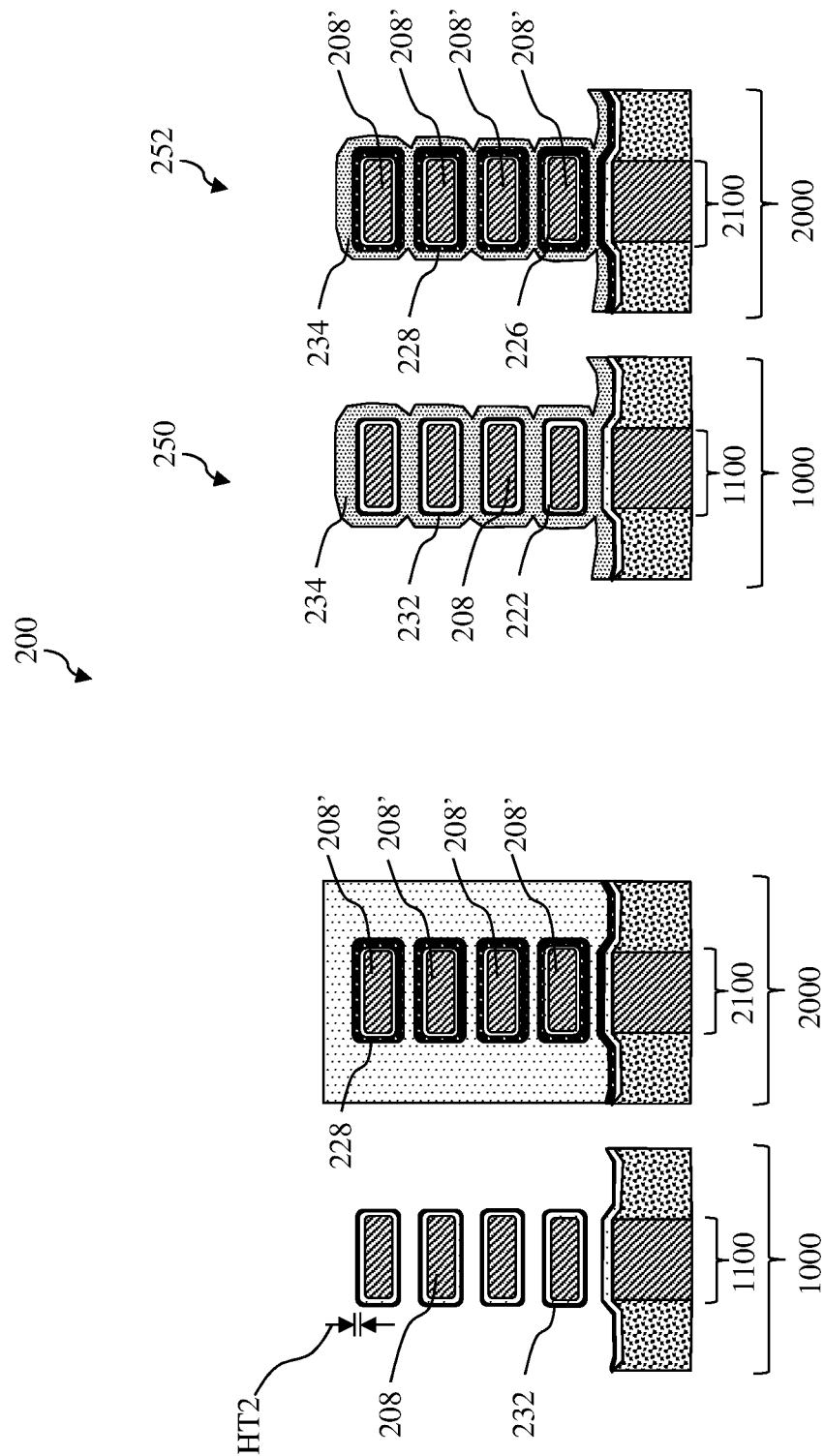

Referring to FIGS. 1, 10 and 11, the method 100 includes a block 118 where the first dielectric layer 228 over the first interfacial layer 222 is thinned. In some embodiments, a second mask layer 230 may be formed over the second area 2000 to cover the first dielectric layer 228 over the second channel members 208' while the first dielectric layer 228 in the first area 1000 is exposed for thinning. In some embodiments, the second mask layer 230 may be a photoresist layer, such as a bottom antireflective coating (BARC) layer. At block 118, the exposed first dielectric layer 228 in the first area 1000 is thinned while the first dielectric layer 228 in the second area 2000 is covered by the second mask layer 230. In some implementations represented in FIG. 11, the first dielectric layer 228 is thinned to form a second dielectric layer 232 that has a second high-k thickness (HT2) smaller than the first high-k thickness (HT1). In some instances, the second dielectric layer 232 may be completely removed and the second high-k thickness (HT2) may be zero. Therefore, the second high-k thickness (HT2) may be between about 0 Å and about 10 Å. The smaller thickness or lack of the second dielectric layer 232 allows more spacing between adjacent first channel members 208.

Referring to FIGS. 1 and 12, the method 100 includes a block 120 where metal gate electrodes 234 are formed over the first channel region 1100 and the second channel region 2100. Upon conclusion of operations at block 120, a first GAA device 250 and a second GAA device 252 are substantially formed. It is noted that the first channel region 1100 and the second channel region 2100 shown in FIG. 12 represent the channel regions of the same device type. For example, FIG. 12 represents a first channel region 1100 and a second channel region 2100 for n-type devices or a first channel region 1100 and a second channel region 2100 for p-type devices. That is, each of the metal gate electrodes 234 shown in FIG. 12 may either be a n-type metal gate electrode or a p-type metal gate electrode. Consequently, in some embodiments of the present disclosure, the n-type metal gate electrodes for devices in the first area 1000 and the second area 2000 may be formed simultaneously in a similar process flow and the p-type metal gate electrodes for devices in the first area 1000 and the second area 2000 may be formed simultaneously in a similar process flow. As will be described below, the present disclosure also provides a method 300 in FIG. 13 and a method 400 for forming different metal gate electrodes or portions thereof for different type of devices.

In some embodiment when both the first channel region 1100 and the second channel region 2100 are for n-type devices, the metal gate electrode 234 may include an n-dipole layer, an n-type metal stack, or a p-type metal stack, or a combination thereof. In some instances, the n-dipole layer may include lanthanum oxide, magnesium oxide, or yttrium oxide. In some implementations, the n-type metal stack may include titanium aluminum, titanium aluminum carbide, or tantalum aluminum carbide and the p-type metal stack may titanium nitride, titanium silicon nitride, tantalum nitride, tungsten carbonitride, or titanium aluminum nitride.

In some embodiment when both the first channel region 1100 and the second channel region 2100 are for p-type devices, the metal gate electrode 234 may include a p-dipole layer, an n-type metal stack, or a p-type metal stack, or a combination thereof. In some instances, the p-dipole layer may include aluminum oxide, titanium oxide, or niobium oxide. In some implementations, the p-type metal stack may titanium nitride, titanium silicon nitride, tantalum nitride, tungsten carbonitride, or titanium aluminum nitride and the n-type metal stack may include titanium aluminum, titanium aluminum carbide, or tantalum aluminum carbide.

Referring now to FIG. 1, the method 100 includes a block 122 where further processes are performed. In some embodiments, such further processes may include formation of an interlayer dielectric (ILD) layer, formation of the source/drain contacts through the ILD layer to couple to the source/drain features, and formation of gate connects to couple to the gate structures.

Figure 13:
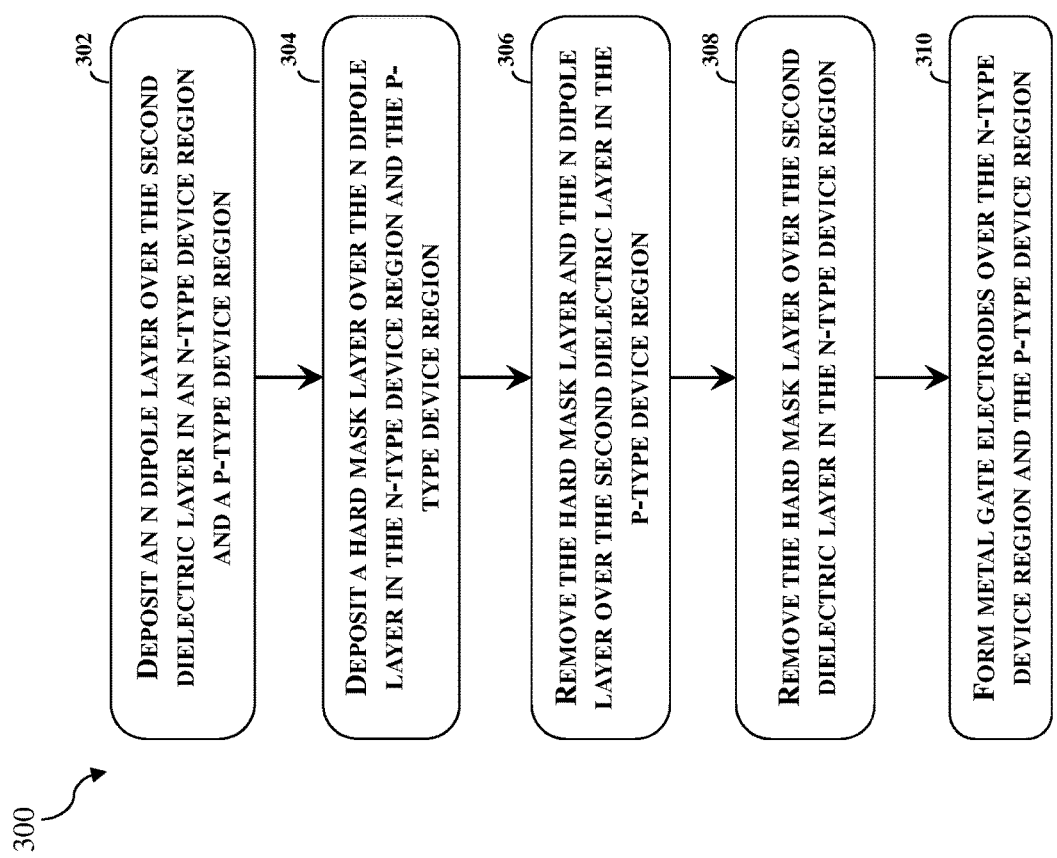
FIG. 13 is a flowchart illustrating a method of forming a semiconductor device according to an embodiment of the present disclosure.
Figure 19:
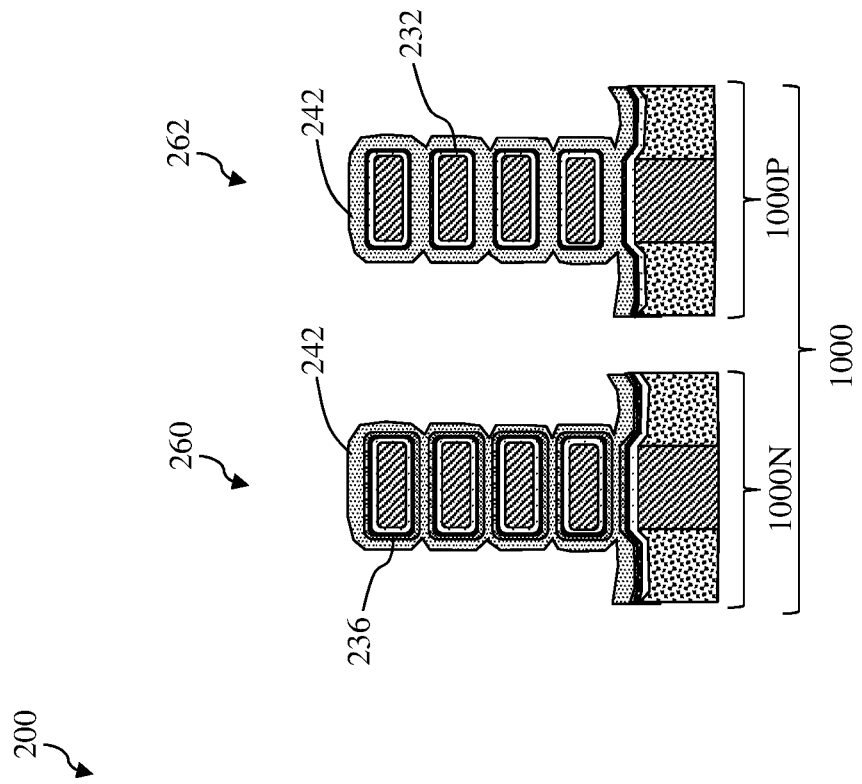
Figure 20:
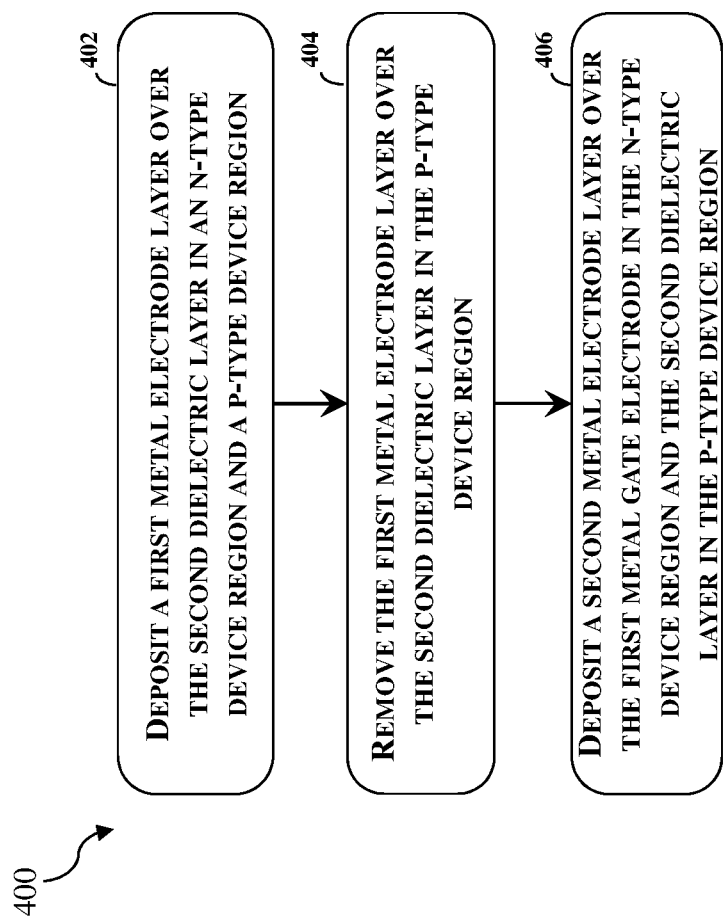
FIG. 20 is a flowchart illustrating a method of forming a semiconductor device according to an embodiment of the present disclosure.

The method 300 in FIG. 13 and the method 400 in FIG. 20 illustrate two example processes to form different metal gate electrodes to create threshold voltage differentiation between n-type and p-type devices. The method 300 in FIG. 13 will be described below in conjunction with FIGS. 14-19, which are fragmentary cross-sectional views of an I/O area 1000 in a workpiece at various stages of fabrication according to method 300. The method 400 in FIG. 20 will be described below in conjunction with FIGS. 21-25, which are fragmentary cross-sectional views of an I/O area 1000 in a workpiece at various stages of fabrication according to method 400. It is noted that while FIGS. 14-19 and 21-25 only illustrate formation of different types of metal gate electrode layers in the I/O area 1000, application of the methods 300 and 400 is not limited to the I/O area 1000. It should be appreciated that the methods 300 and 400 may be applicable to the core area 2000 as well.

Figure 15:
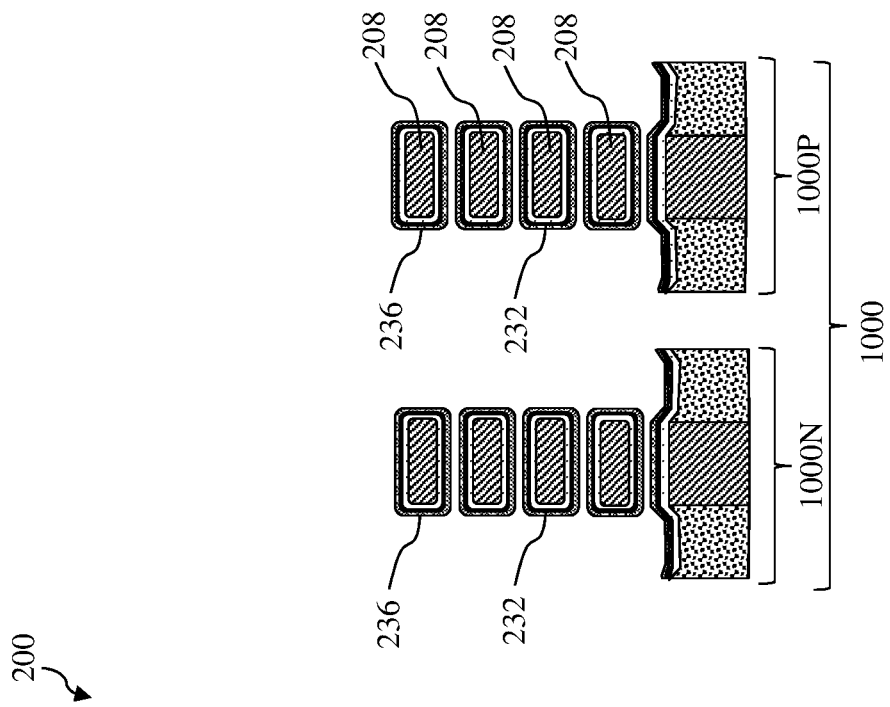
FIGS. 14-19 illustrate fragmentary cross-sectional views of the first device area and the second device area of the workpiece at various stages of fabrication in accordance with the method in FIG. 13.
Figure 14:
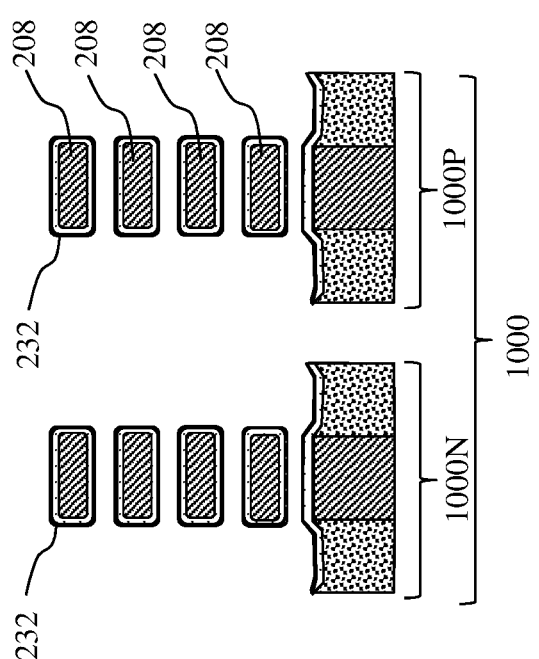

Referring now to FIGS. 13, 14 and 15, the method 300 includes a block 302 where an n-dipole layer 236 is deposited over the second dielectric layer 232 in the n-type device region 1000N and the p-type device region 1000P. In some embodiments, the method 300 may be performed after block 118 of the method 100, as illustrated in FIG. 11. As shown in FIG. 14, upon completion of block 118 of the method 100, the first channel members 208 in an n-type device region 1000N and a p-type device region 1000P are covered by the first interfacial layer 222 and the second dielectric layer 232. In some embodiments, the n-dipole layer 236 has a stronger electron affinity than the first interfacial layer 222 or the second dielectric layer 232 (if not completely removed) such that electrons may be drawn towards the n-dipole layer 236 at an interface between the n-dipole layer 236 and the second dielectric layer 232 or between the n-dipole layer 236 and the first interfacial layer 222. In some embodiments, the n-dipole layer 236 may be deposited using ALD or CVD and may be formed of lanthanum oxide, magnesium oxide, or yttrium oxide. In some implementations, a thickness of the n-dipole layer may be between about 0 Å and about 10 Å.

Figure 17:
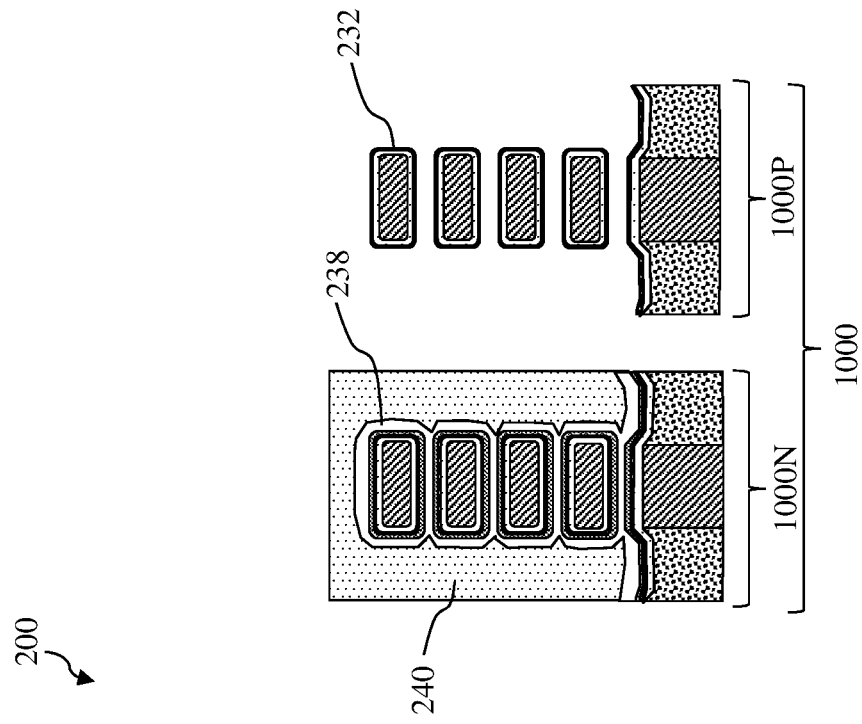
Figure 16:
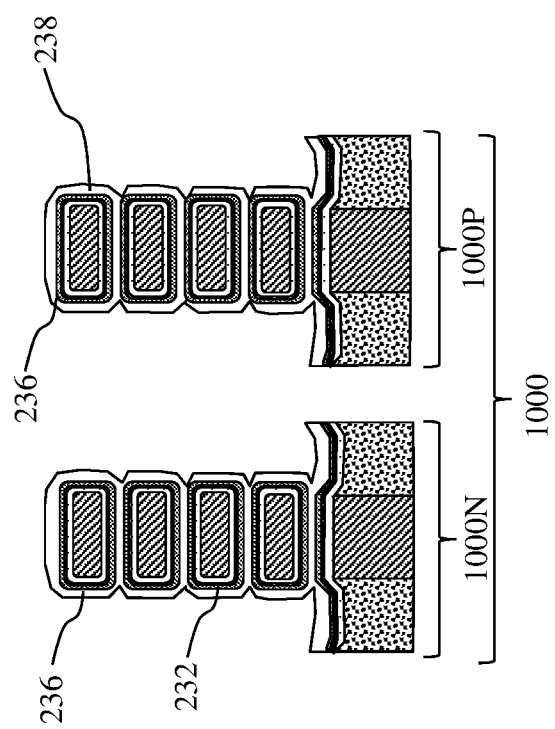

Referring now to FIGS. 13 and 16, the method 300 includes a block 304 where a hard mask layer 238 is deposited over the n-dipole layer 236 in the n-type device region 1000N and the p-type device region 1000P. In some embodiments, the hard mask layer 238 may be formed of silicon nitride, aluminum nitride, aluminum oxide, titanium oxynitride, silicon oxycarbide, silicon carbide, or tantalum nitride. Referring now to FIGS. 13 and 17, the method 300 includes a block 306 where the hard mask layer 238 and the n-dipole layer 236 over the second dielectric layer 232 in the p-type device region 1000P is removed. In an example process, a third mask layer 240 may be deposited over the workpiece 200, including over the n-type device region 1000N and the p-type device region 1000P in the first area 1000. Similar to the first mask layer 224 or the second mask layer 230, the third mask layer 240 may be a photoresist layer, such as a BARC layer. At block 306, the third mask layer 240 may be patterned to cover the hard mask layer 238 in the n-type device region 1000N while the hard mask layer 238 in the p-type device region 1000P is exposed. Then the workpiece 200 may be etched using the third mask layer 240 as an etch mask to remove the n-dipole layer 236 and the hard mask layer 238 in the p-type device region 1000P. In implementations where the second dielectric layer 232 is present (not completely removed at block 118 of the method 100), the second dielectric layer 232 may function as an etch stop layer to prevent unintended over-etch of the first channel members 208.

Figure 18:
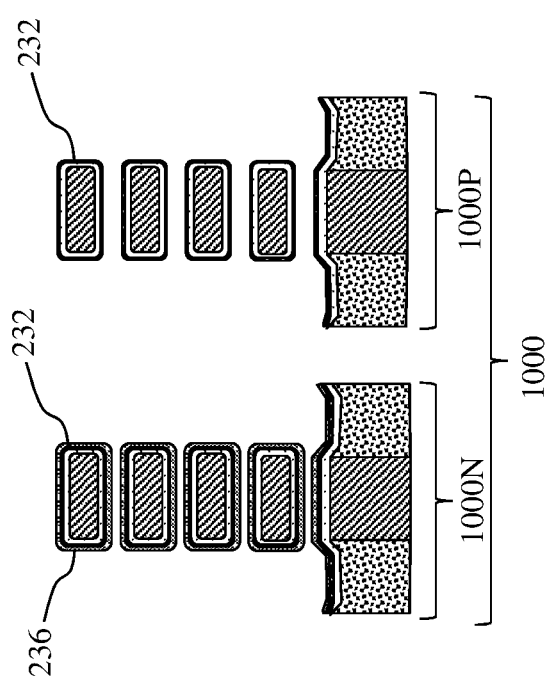

Referring now to FIGS. 13 and 18, the method 300 includes a block 308 where the hard mask layer 238 over the second dielectric layer 232 in the n-type device region 1000N and the p-type device region 1000P is removed. After the n-dipole layer 236 in the p-type device region 1000P is removed, the third mask layer 240 may be removed by ashing or other suitable method.

Referring now to FIGS. 13 and 19, the method 300 includes a block 310 where a common metal gate electrode layer 242 are formed over the n-type device region 1000N and the p-type device region 1000P. Upon conclusion of operations at block 310, a first n-type GAA device 260 and a first p-type GAA device 262 are substantially formed. In some embodiments, the common metal gate electrode layer 242 may be deposited using ALD or CVD and may be formed of titanium nitride, titanium silicon nitride, titanium aluminum nitride, tungsten carbonitride, titanium aluminum carbide, titanium aluminide, or a combination thereof. Upon conclusion of the method 300, the metal gate electrode in the n-type device region 1000N is different from the metal gate electrode in the p-type device region 1000P in that the former having the additional n-dipole layer 236. In an alternative embodiment, instead of selective deposition of the n-dipole layer 236 in the n-type device region 1000N, a p-dipole layer (not shown) is deposited over the second dielectric layer 232 in the n-type device region 1000N and the p-type device region 1000P and the portion of the p-dipole layer over the n-type device region 1000N is removed before the common metal gate electrode layer 242 is deposited over the first channel members 208. In the alternative embodiment, the metal gate electrode in the n-type device region 1000N is different from the metal gate electrode in the p-type device region 1000P in that the latter having the additional p-dipole layer in the p-type device region 1000P. As compared to the n-dipole layer 236, the p-dipole layer has a stronger hole affinity than the first interfacial layer 222 or the second dielectric layer 232 (if not completely removed) such that holes may be drawn towards the p-dipole layer at an interface between the p-dipole layer and the second dielectric layer 232 or between the p-dipole layer and the first interfacial layer 222.

Figure 22:
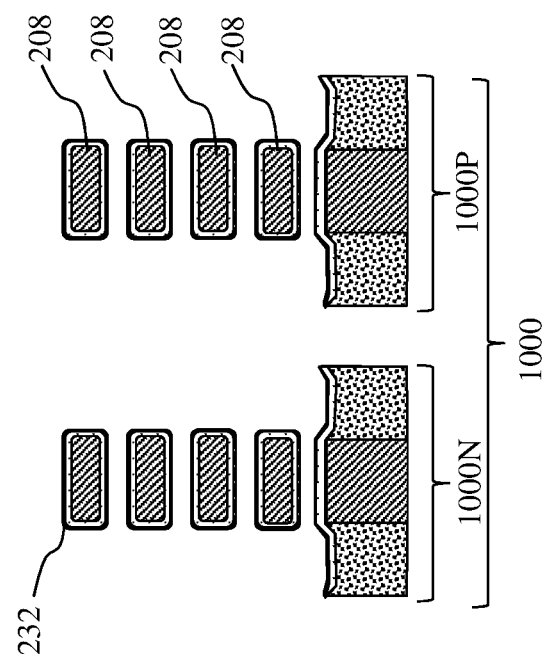
FIGS. 21-25 illustrate fragmentary cross-sectional views of the first device area and the second device area of the workpiece at various stages of fabrication in accordance with the method in FIG. 20.
Figure 21:
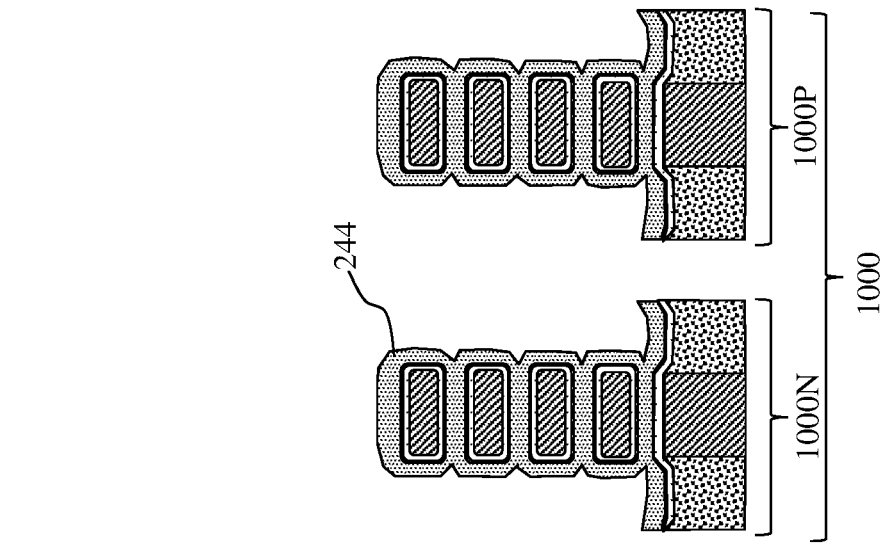

Referring now to FIGS. 20, 21 and 22, the method 400 includes a block 402 where a first metal electrode layer 244 is deposited over the second dielectric layer 232 in the n-type device region 1000N and p-type device region 1000P. In some embodiments, the method 400 may be performed after block 118 of the method 100, as illustrated in FIG. 11. As shown in FIG. 21, upon completion of block 118 of the method 100, the first channel members 208 in an n-type device region 1000N and a p-type device region 1000P are covered by the first interfacial layer 222 and the second dielectric layer 232. At block 402, the first metal electrode layer 244 may be an n-type metal electrode layer and may include titanium aluminide, titanium aluminum carbide, tantalum aluminum carbide, or a combination thereof. In some implementations, the first metal electrode layer 244 may be deposited using ALD, CVD, or a suitable method.

Figure 24:
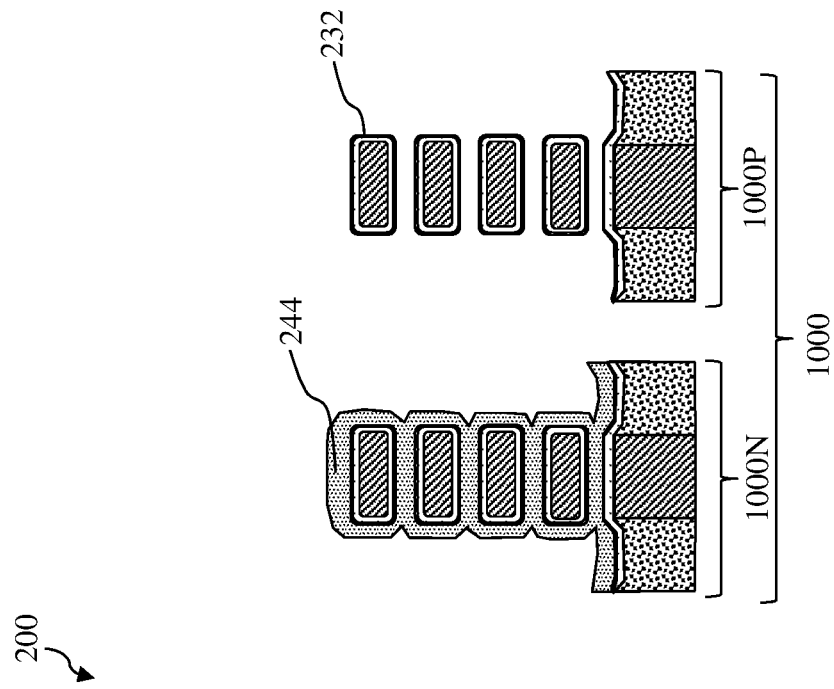
Figure 23:
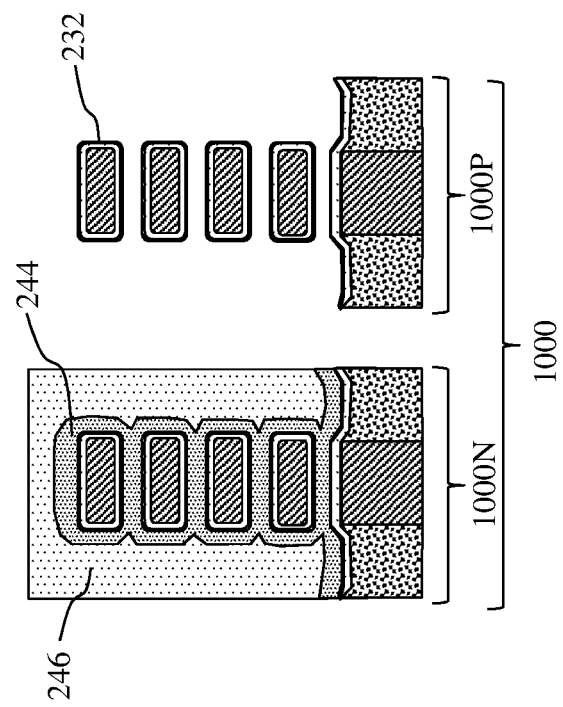

Referring now to FIGS. 20, 23 and 24, the method 400 includes a block 404 where the first metal electrode layer 244 over the second dielectric layer 232 in the p-type device region 1000P is removed. In an example process, block 404 may be performed by depositing a fourth mask layer 246 over the first metal electrode layer 244 in the n-type device region 1000N and the p-type device region 1000P. Similar to the first mask layer 224, the second mask layer 230 or the third mask layer 240, the fourth mask layer 246 may be a photoresist layer, such as a BARC layer. At block 404, the fourth mask layer 246 may be patterned to cover the first metal electrode layer 244 in the n-type device region 1000N while the first metal electrode layer 244 in the p-type device region 1000P is exposed. Then the workpiece 200 may be etched using the patterned fourth mask layer 246 as an etch mask to remove the first metal electrode layer 244 in the p-type device region 1000P, as illustrated in FIG. 23. Referring now to FIG. 24, the patterned fourth mask layer 246 may then be removed using a suitable method, such as ashing.

Figure 25:
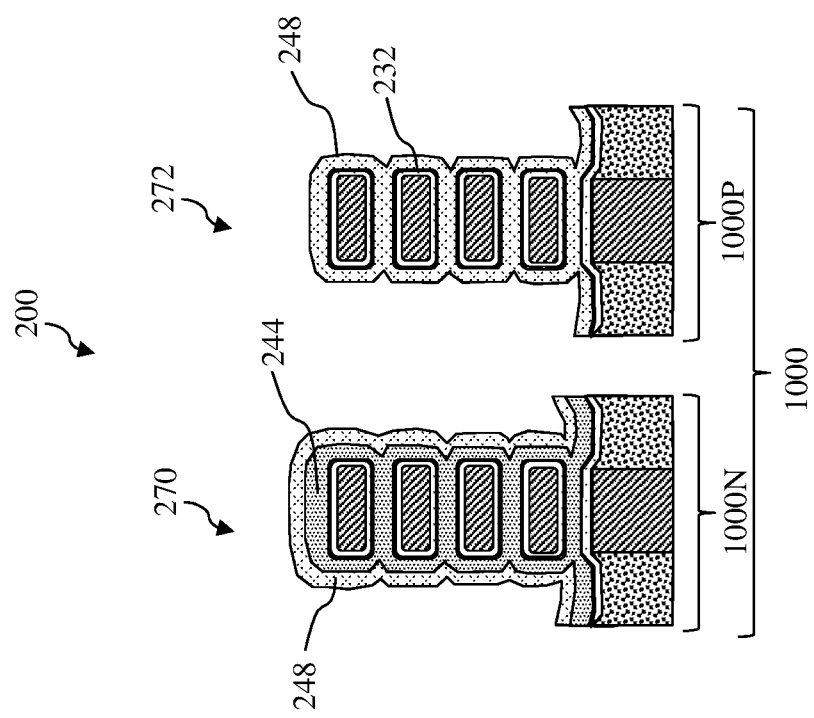

Referring now to FIGS. 20 and 25, the method 400 includes a block 406 where a second metal electrode layer 248 is deposited over the first metal gate electrode layer 244 in the n-type device region 1000N and the second dielectric layer 232 in the p-type device region 1000P. Upon conclusion of operations at block 406, a second n-type GAA device 270 and a second p-type GAA device 272 are substantially formed. In some embodiments, the second metal electrode layer 248 may be of a type different from that of the first metal electrode layer 244. In instances where the first metal electrode layer 244 is of n-type, the second metal electrode layer 248 is of p-type. In those instances, the first metal electrode layer 244 may be referred to as the n-type work function layer and the second metal electrode layer 248 may be referred to as the p-type work function layer. In some embodiments, the second metal electrode layer 248 may include titanium nitride, titanium silicon nitride, tantalum nitride, tungsten carbonitride, titanium aluminum nitride, or a combination thereof. Upon conclusion of the method 400, the metal gate electrode in the n-type device region 1000N is different from the metal gate electrode in the p-type device region 1000P in that the former having the both the first metal electrode layer 244 and the second metal electrode layer 248 while the latter having only the second metal electrode layer 248. In an alternative embodiment, instead of selective deposition of the first metal electrode layer 244 in the n-type device region 1000N, the second metal electrode layer 248 is deposited over the second dielectric layer 232 in the n-type device region 1000N and the p-type device region 1000P and the portion of the second metal electrode layer 248 over the n-type device region 1000N is removed before the first metal electrode layer 244 is deposited over the first channel members 208 in the n-type device region 1000n and the p-type device region 1000P. In the alternative embodiment, the metal gate electrode in the n-type device region 1000N is different from the metal gate electrode in the p-type device region 1000P in that the latter having both the first metal electrode layer 244 and the second metal electrode layer 248.

Based on the above discussions, the present disclosure offers advantages over conventional semiconductor devices that include limited spacing between channel members of GAA transistor in I/O device area. It is understood, however, that other embodiments may offer additional advantages, and not all advantages are necessarily disclosed herein, and that no particular advantage is required for all embodiments. The present disclosure puts forth a semiconductor device that includes an I/O device region for I/O functions and a core device region for logic and memory functions. As compared to GAA devices in the core device region, the GAA devices in the I/O device region have a thinner high-k dielectric layer to increase the spacing between adjacent channel members. In some embodiments, the high-k dielectric layer of the GAA devices in the I/O device region may be completely removed to maximize the spacing between adjacent channel members. The increased spacing between adjacent channel members allows different arrangements of dipole layers and metal electrode layer to achieve threshold voltage differentiation between different types of devices. In addition, the increase of the spacing between adjacent channel members in the I/O device regions allows similar process flows to form devices in I/O device area and the core device area, thereby reducing manufacturing cost of semiconductor devices.

The disclosure of the present disclosure provides embodiments of semiconductor devices and methods of forming the same. In one embodiment, a semiconductor device is provided. The semiconductor device includes a first gate-all-around (GAA) transistor and a second GAA transistor. The first GAA transistor includes a first plurality of channel members, a first interfacial layer over the first plurality of channel members, a first hafnium-containing dielectric layer over the first interfacial layer, and a metal gate electrode layer over the first hafnium-containing dielectric layer. The second GAA transistor includes a second plurality of channel members, a second interfacial layer over the second plurality of channel members, a second hafnium-containing dielectric layer over the second interfacial layer, and the metal gate electrode layer over the second hafnium-containing dielectric layer. A first thickness of the first interfacial layer is greater than a second thickness of the second interfacial layer. A third thickness of the first hafnium-containing dielectric layer is smaller than a fourth thickness of the second hafnium-containing dielectric layer.

In some embodiments, the first GAA transistor is disposed in an input/output (I/O) device area and the second GAA transistor is disposed in a core device area. In some implementations, the first thickness is between about 15 Å and about 35 Å and the second thickness is between about 5 Å and about 15 Å. In some instances, the third thickness is smaller than about 10 Å and the fourth thickness is between about 14 Å and about 18 Å. In some embodiments, the metal gate electrode includes titanium nitride, titanium silicon nitride, titanium aluminum carbide, titanium aluminum nitride, titanium aluminide, or tungsten carbonitride. In some instances, the first hafnium-containing dielectric layer and the second hafnium-containing dielectric layer includes hafnium oxide, hafnium zirconium oxide, hafnium silicon oxide, hafnium silicon oxynitride, or hafnium aluminum oxide. In some implementations, the first GAA transistor is an n-type GAA transistor, the first GAA transistor further includes an n-dipole layer disposed between the metal gate electrode and the first hafnium-containing dielectric layer, and the n-dipole layer includes lanthanum oxide, magnesium oxide, or yttrium oxide. In some implementations, the first GAA transistor is a p-type GAA transistor, the first GAA transistor further includes a p-dipole layer disposed between the metal gate electrode layer and the first hafnium-containing dielectric layer, and the p-dipole layer includes aluminum oxide, titanium oxide, or niobium oxide.

In another embodiment, a semiconductor device is provided. The semiconductor device includes a first gate-all-around (GAA) transistor in an input/output (I/O) device area, a second gate-all-around (GAA) transistor in the I/O device area, and a third GAA transistor in a logic device area different from the I/O device area. The first GAA transistor includes a first plurality of channel members, a first interfacial layer over the first plurality of channel members, a first hafnium-oxide-containing dielectric layer over the first interfacial layer, and a first metal gate electrode layer over the first interfacial layer. The second GAA transistor includes a second plurality of channel members, the first interfacial layer over the second plurality of channel members, the first hafnium-oxide-containing dielectric layer over the first interfacial layer, and a second metal gate electrode layer over the first interfacial layer. The third GAA transistor includes a third plurality of channel members, a second interfacial layer over the third plurality of channel members, and a second hafnium-oxide-containing dielectric layer over the second interfacial layer. The first thickness of the first interfacial layer is greater than a second thickness of the second interfacial layer, and a third thickness of the first hafnium-oxide-containing dielectric layer is smaller than a fourth thickness of the second hafnium-oxide-containing dielectric layer.

In some embodiments, the first GAA transistor is n-type and the second GAA transistor is p-type. The first metal gate electrode layer includes an n-type work function layer and a p-type work function layer. The second metal gate electrode layer includes the p-type work function layer. The n-type work function layer includes titanium aluminide, titanium aluminum carbide, or tantalum aluminum carbide. The p-type work function layer includes titanium nitride, titanium silicon nitride, tantalum nitride, tungsten carbonitride, or titanium aluminum nitride. In some embodiments, the first GAA transistor is n-type and the second GAA transistor is p-type, the first metal gate electrode layer comprises an n-type work function layer, the second metal gate electrode layer includes the n-type work function layer and a p-type work function layer, the n-type work function layer includes titanium aluminide, titanium aluminum carbide, or tantalum aluminum carbide, and the p-type work function layer includes titanium nitride, titanium silicon nitride, tantalum nitride, tungsten carbonitride, or titanium aluminum nitride. In some implementations, the first GAA transistor is n-type and the second GAA transistor is p-type, the first GAA transistor further includes an n-dipole layer disposed between the first hafnium-oxide-containing dielectric layer and the first metal gate electrode layer, the first hafnium-oxide-containing dielectric layer of the second GAA transistor is in direct contact with the first metal gate electrode layer of the second GAA transistor, and the n-dipole layer includes lanthanum oxide, magnesium oxide, or yttrium oxide. In some instances, the first GAA transistor is n-type and the second GAA transistor is p-type, the first hafnium-oxide-containing dielectric layer of the first GAA transistor is in direct contact with the first metal gate electrode layer of the first GAA transistor, the second GAA transistor further includes a p-dipole layer disposed between the first hafnium-oxide-containing dielectric layer and the first metal gate electrode layer, and the p-dipole layer includes aluminum oxide, titanium oxide, or niobium oxide.

In a further embodiment, a method is provided. The method includes forming a plurality of alternating semiconductor layers over a first region and a second region of a substrate where the plurality of alternating semiconductor layers include a first plurality of first semiconductor layers interleaved by a second plurality of second semiconductor layers, patterning the plurality of alternating semiconductor layers over the first region to form a first active region, patterning the plurality of alternating semiconductor layers over the second region to form a second active region, selectively removing the second plurality of second semiconductor layers to form first channel members in the first active region and second channel members in the second active region, forming a first interfacial layer over the first channel members to a first thickness, forming a second interfacial layer over the second channel members to a second thickness smaller than the first thickness, forming a first hafnium-containing dielectric layer over the first interfacial layer to a third thickness, and forming a second hafnium-containing dielectric layer over the second interfacial layer to a fourth thickness greater than the third thickness.

In some embodiments, the forming of the first hafnium-containing dielectric layer over the first interfacial layer includes depositing the second hafnium-containing dielectric layer over the first interfacial layer in the first active region and the second interfacial layer in the second active region, masking the second hafnium-containing dielectric layer in the second active region, and thinning the second hafnium-containing dielectric layer in the first active region to form the first hafnium-containing dielectric layer. In some embodiments, the first interfacial layer and the second interfacial layer includes silicon oxide or silicon oxynitride. In some implementations, the first hafnium-containing dielectric layer and the second hafnium-containing dielectric layer includes hafnium oxide, hafnium zirconium oxide, hafnium silicon oxide, hafnium silicon oxynitride, or hafnium aluminum oxide. In some instances, the first thickness is between about 15 Å and about 35 Å and the second thickness is between about 5 Å and about 15 Å. In some embodiments, the third thickness is smaller than about 10 Å and the fourth thickness is between about 14 Å and about 18 Å. In some instances, the thinning of the second hafnium-containing dielectric layer includes using the second hafnium-containing dielectric layer as an etch stop layer.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, by implementing different thicknesses for the bit-line conductor and word line conductor, one can achieve different resistances for the conductors. However, other techniques to vary the resistances of the metal conductors may also be utilized as well.

What is claimed is:

1. A method, comprising:
   forming first channel members over a first region of a substrate and second channel members over a second region of the substrate;

forming a first interfacial layer over the first channel members to a first thickness;
forming a second interfacial layer over the second channel members to a second thickness smaller than the first thickness;
forming a first hafnium-containing dielectric layer over the first interfacial layer to a third thickness; and
forming a second hafnium-containing dielectric layer over the second interfacial layer to a fourth thickness greater than the third thickness.

2. The method of claim 1, wherein the forming of the first hafnium-containing dielectric layer over the first interfacial layer comprises:
depositing the second hafnium-containing dielectric layer over the first interfacial layer in the first region and the second interfacial layer in the second region;
masking the second hafnium-containing dielectric layer in the second region; and
thinning the second hafnium-containing dielectric layer in the first region to form the first hafnium-containing dielectric layer.

3. The method of claim 1, wherein the first interfacial layer and the second interfacial layer comprises silicon oxide or silicon oxynitride.

4. The method of claim 1, wherein the first hafnium-containing dielectric layer and the second hafnium-containing dielectric layer comprises hafnium oxide, hafnium zirconium oxide, hafnium silicon oxide, hafnium silicon oxynitride, or hafnium aluminum oxide.

5. The method of claim 1,
wherein the first thickness is between about 15 Å and about 35 Å,
wherein the second thickness is between about 5 Å and about 15 Å.

6. The method of claim 1,
wherein the third thickness is smaller than about 10 Å,
wherein the fourth thickness is between about 14 Å and about 18 Å.

7. The method of claim 2, wherein the thinning of the second hafnium-containing dielectric layer comprises:
using the second hafnium-containing dielectric layer as an etch stop layer.

8. A method, comprising:
forming first nanostructures over a first region of a substrate and second nanostructures over a second region of the substrate;
forming a first interfacial layer over the first nanostructures and the second nanostructures to a first thickness;
selectively removing the first interfacial layer over the second nanostructures;
after the selectively removing, forming a second interfacial layer over the second nanostructures to a second thickness smaller than the first thickness;
forming a first gate dielectric layer over the first interfacial layer and the second interfacial layer to a third thickness; and
selectively thinning the first gate dielectric layer over the first interfacial layer to form a second gate dielectric layer having a fourth thickness smaller than the third thickness.

9. The method of claim 8, wherein the selectively removing comprises:
forming a first mask layer over the first region while the second region is exposed.

10. The method of claim 9, wherein the first mask layer comprises a bottom antireflective coating (BARC) layer.

11. The method of claim 8, wherein the selectively thinning comprises:
forming a second mask layer over the second region while the first region is exposed.

12. The method of claim 8,
wherein the first nanostructures are vertically stacked one over another,
wherein the second nanostructures are vertically stacked one over another.

13. The method of claim 8,
wherein the first thickness is between about 15 Å and about 35 Å,
wherein the second thickness is between about 5 Å and about 15 Å.

14. The method of claim 8,
wherein the third thickness is smaller than about 10 Å,
wherein the fourth thickness is between about 14 Å and about 18 Å.

15. The method of claim 8, wherein the first gate dielectric layer and the second gate dielectric layer comprise hafnium oxide, hafnium zirconium oxide, hafnium silicon oxide, hafnium silicon oxynitride, hafnium aluminum oxide, or a combination thereof.

16. A method, comprising:
forming first nanostructures over a first region of a substrate and second nanostructures over a second region of the substrate;
selectively forming a first interfacial layer over the first nanostructures to a first thickness;
selectively forming a second interfacial layer over the second nanostructures to a second thickness smaller than the first thickness;
selectively forming a first gate dielectric layer over the second interfacial layer to a third thickness; and
selectively forming a second gate dielectric layer over the first interfacial layer to a fourth thickness smaller than the third thickness.

17. The method of claim 16, wherein a composition of the first gate dielectric layer is identical to a composition of the second gate dielectric layer.

18. The method of claim 16, further comprising:
depositing an n-dipole layer over the first gate dielectric layer and the second gate dielectric layer;
selectively removing the n-dipole layer over the first gate dielectric layer; and
after the selectively removing, depositing a gate electrode layer over the n-dipole layer in the first region and the first gate dielectric layer in the second region.

19. The method of claim 18, wherein the n-dipole layer comprises lanthanum oxide, magnesium oxide, or yttrium oxide.

20. The method of claim 18, wherein the gate electrode layer comprises titanium nitride, titanium silicon nitride, titanium aluminum nitride, tungsten carbonitride, titanium aluminum carbide, titanium aluminide.

* * * * *